United States Patent
Jiwari et al.

(10) Patent No.: US 6,703,711 B2
(45) Date of Patent: Mar. 9, 2004

(54) SEMICONDUCTOR DEVICE AND METHOD FOR FABRICATING THE SAME

(75) Inventors: Nobuhiro Jiwari, Osaka (JP); Shinichi Imai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/330,152

(22) Filed: Dec. 30, 2002

(65) Prior Publication Data

US 2003/0094698 A1 May 22, 2003

Related U.S. Application Data

(62) Division of application No. 09/708,084, filed on Nov. 8, 2000, now Pat. No. 6,500,769.

(30) Foreign Application Priority Data

Nov. 10, 1999 (JP) ............................. 11-319088

(51) Int. Cl.[7] .................. H01L 23/48; H01L 23/52; H01L 29/40
(52) U.S. Cl. ...................... 257/759; 257/758
(58) Field of Search ................. 257/758, 759, 257/760, 761, 765; 438/762, 784

(56) References Cited

U.S. PATENT DOCUMENTS

| | | | | |
|---|---|---|---|---|
| 4,267,238 A | * | 5/1981 | Chernega | 428/422 |
| 4,419,404 A | * | 12/1983 | Arai et al. | 428/336 |
| 4,880,687 A | | 11/1989 | Yokoyama et al. | |
| 5,607,782 A | | 3/1997 | Ishida et al. | |
| 5,989,998 A | | 11/1999 | Sugahara et al. | |
| 6,033,979 A | | 3/2000 | Endo | |
| 6,186,153 B1 | | 2/2001 | Kitsunai et al. | |
| 2001/0026956 A1 | | 10/2001 | Baklanov et al. | |

FOREIGN PATENT DOCUMENTS

JP  10-199976  7/1998

* cited by examiner

Primary Examiner—Erik J. Kielin
Assistant Examiner—William C. Vesperman
(74) Attorney, Agent, or Firm—Nixon Peabody LLP; Donald R. Studebaker

(57) ABSTRACT

A fluorine-containing organic film having a relative dielectric constant of 4 or less is deposited on a semiconductor substrate using a material gas containing fluorocarbon as a main component in a reactor chamber of a plasma processing apparatus. During the deposition of the fluorine-containing organic film, a scavenger gas for scavenging fluorine constituting the fluorocarbon is mixed in the material gas. The proportion of the mixed scavenger gas in the material gas is changed to adjust the mechanical strength and relative dielectric constant of the fluorine-containing organic film.

1 Claim, 5 Drawing Sheets

SEMICONDUCTOR DEVICE AND METHOD FOR FABRICATING THE SAME

Divisional prior application No.: 09/708,084 filed Nov. 8, 2000 now U.S. Pat. No. 6,500,769.

BACKGROUND OF THE INVENTION

The present invention relates to a semiconductor device that includes a fluorine-containing organic film having a low relative dielectric constant and a method for fabricating the same.

With recent remarkable progress in semiconductor process technology, finer semiconductor elements and metal interconnections with higher integration have been pursued. With this trend toward finer size and higher integration, signal delay at metal interconnections has come to greatly influence the operation speed of semiconductor integrated circuits.

In the above situation, desired is a technique of forming a fluorine-containing organic film (fluorocarbon film) that contains carbon atoms and fluorine atoms as main components and has a relative dielectric constant lower than that of an inorganic film such as a $SiO_2$ film or a SiOF film.

A fluorine-containing organic film has a relative dielectric constant of about 2, which is lower than the relative dielectric constant of a SiOF film (about 3.5 to about 3.8). Accordingly, by depositing such a fluorine-containing organic film between metal interconnections or on the top surfaces of metal interconnections, signal delay at the metal interconnections can be reduced.

However, the fluorine-containing organic film deposited using a material gas containing fluorine described above is disadvantageously poor in denseness and thus insufficient in mechanical strength, heat resistance, chemical resistance, and the like.

In order to solve the above problem, Japanese Laid-Open Patent Publication No. 10-199976 proposes a method for densifying a fluorine-containing organic film to improve mechanical strength, oxidation resistance, and heat resistance in the following manner. A copolymer of a polytetrafluoroethylene resin or a cyclic fluorine resin and siloxane is dissolved in a fluorocarbon solvent. The resultant solution is applied to a substrate while rotating, to obtain a fluorine-containing organic film. The resultant fluorine-containing organic film is then subjected to annealing where the film is kept in an atmosphere of an inert gas such as nitrogen gas at a temperature of 400° C. for 30 minutes.

By the annealing of the fluorine-containing organic film, the film is densified and thus the mechanical strength improves as described above. However, since fluorine atoms in the film are volatilized by the annealing, the relative dielectric constant of the film increases. That is, if no annealing is performed, the relative dielectric constant is low, but the mechanical strength is poor. If annealing is performed, the mechanical strength improves, but the relative dielectric constant becomes high. In other words, reduction in relative dielectric constant and improvement in mechanical strength are completely in the trade-off relationship where selection of either one only is allowed.

SUMMARY OF THE INVENTION

In view of the above, the object of the present invention is allowing control of the amount of fluorine atoms contained in a fluorine-containing organic film to balance reduction in relative dielectric constant with improvement in mechanical strength.

In order to attain the above object, the first method for fabricating a semiconductor device of the present invention includes the step of: depositing a fluorine-containing organic film having a relative dielectric constant of 4 or less on a semiconductor substrate using a material gas containing fluorocarbon as a main component in a reactor chamber of a plasma processing apparatus, wherein in the deposition of a fluorine-containing organic film, a scavenger gas for scavenging fluorine constituting the fluorocarbon is mixed in the material gas, and the proportion of the mixed scavenger gas in the material gas is changed to adjust the mechanical strength and relative dielectric constant of the fluorine-containing organic film.

According to the first method for fabricating a semiconductor device, the mechanical strength and relative dielectric constant of the fluorine-containing organic film are adjusted by changing the proportion of the scavenger gas mixed in the material gas. Therefore, it is possible to reduce the relative dielectric constant by relatively increasing the amount of fluorine atoms in the film for a fluorine-containing organic film giving high priority to reduction in relative dielectric constant. Contrarily, it is possible to increase the mechanical strength by relatively decreasing the amount of fluorine atoms in the film for a fluorine-containing organic film giving high priority to improvement in mechanical strength. In other words, by changing the proportion of the scavenger gas mixed in the material gas, reduction in relative dielectric constant and improvement in mechanical strength are balanced.

The second method for fabricating a semiconductor device of the present invention includes the steps of: depositing a first fluorine-containing organic film having a relative dielectric constant of 4 or less on a semiconductor substrate using a first material gas in a reactor chamber of a plasma processing apparatus, the first material gas containing fluorocarbon gas mixed with a relatively small amount of a scavenger gas for scavenging fluorine constituting the fluorocarbon; and depositing a second fluorine-containing organic film on the first fluorine-containing organic film using a second material gas in the same reactor chamber, the second fluorine-containing organic film being superior in mechanical strength to and higher in relative dielectric constant than the first fluorine-containing organic film, the second material containing the fluorocarbon gas mixed with a relatively large amount of the scavenger gas.

According to the second method for fabricating a semiconductor device, the first fluorine-containing organic film is deposited using the first material gas containing a scavenger gas for scavenging fluorine constituting the fluorocarbon in a relatively low mixture proportion, while the second fluorine-containing organic film is deposited using the second material gas containing the scavenger gas in a relatively high mixture proportion. Therefore, the first fluorine-containing organic film has a relatively low mechanical strength but has a relatively low relative dielectric constant, while the second fluorine-containing organic film has a relatively high relative dielectric constant but has a relatively high mechanical strength. In this way, by only changing the mixture proportion of the scavenger gas, it is possible to form the first fluorine-containing organic film having a relatively low relative dielectric constant and the second fluorine-containing organic film having a relatively high mechanical strength.

In the first or second fabrication method, the scavenger gas is preferably Co gas. This ensures scavenging of fluorine constituting the fluorocarbon.

In the first or second fabrication method, the fluorocarbon is preferably $C_5F_8$, $C_3F_6$, or $C_4F_6$.

Using the above fluorocarbon, the number of free fluorine atoms in the deposited fluorine-containing organic film decreases. This densifies the fluorine-containing organic film and also improves the adhesion thereof. In addition, $C_5F_8$ gas, $C_3F_6$ gas, and $C_4F_6$ gas less easily cause global warming compared with other perfluorocarbon gases.

In the second fabrication method, the first fluorine-containing organic film is preferably deposited between a plurality of metal interconnections formed on the semiconductor substrate.

With the above construction, since the relative dielectric constant of the first fluorine-containing organic film is low, the capacitance at the metal interconnections is small. In addition, the second fluorine-containing organic film deposited on the first fluorine-containing organic film has a high mechanical strength. Thus, compatibility between reduction in capacitance at the metal interconnection structure and improvement in mechanical strength is attained.

In the second fabrication method, the first material gas may not contain the scavenger gas. This ensures the reduction in the relative dielectric constant of the first fluorine-containing organic film.

Preferably, the second fabrication method further includes the step of: densifying the second fluorine-containing organic film by exposing the second fluorine-containing organic film to plasma of a rare gas in the same reactor chamber.

By the above step, the mechanical strength-of the second fluorine-containing organic film further increases, and the heat resistance and chemical resistance thereof further improve.

The semiconductor device of the present invention includes: a plurality of metal interconnections formed on a semiconductor substrate; a first fluorine-containing organic film deposited at least between the plurality of metal interconnections; and a second fluorine-containing organic film deposited on the first fluorine-containing organic film, wherein the amount of fluorine atoms contained in the second fluorine-containing organic film is smaller than the amount of fluorine atoms contained in the first fluorine-containing organic film.

According to the semiconductor device of the present invention, the first fluorine-containing organic film has a relatively low mechanical strength but has a relatively low relative dielectric constant, while the second fluorine-containing organic film has a relatively high relative dielectric constant but has a relatively high mechanical strength. Thus, compatibility between reduction in capacitance at the metal interconnections and improvement in mechanical strength is attained.

DESCRIPTION OF THE PREFERRED EMBODIMENTS

Hereinafter, an embodiment of the method for fabricating a semiconductor device of the present invention will be described. First, as a precondition, a plasma processing apparatus used for this fabrication method will be described with reference to FIG. 1.

Figure 1:
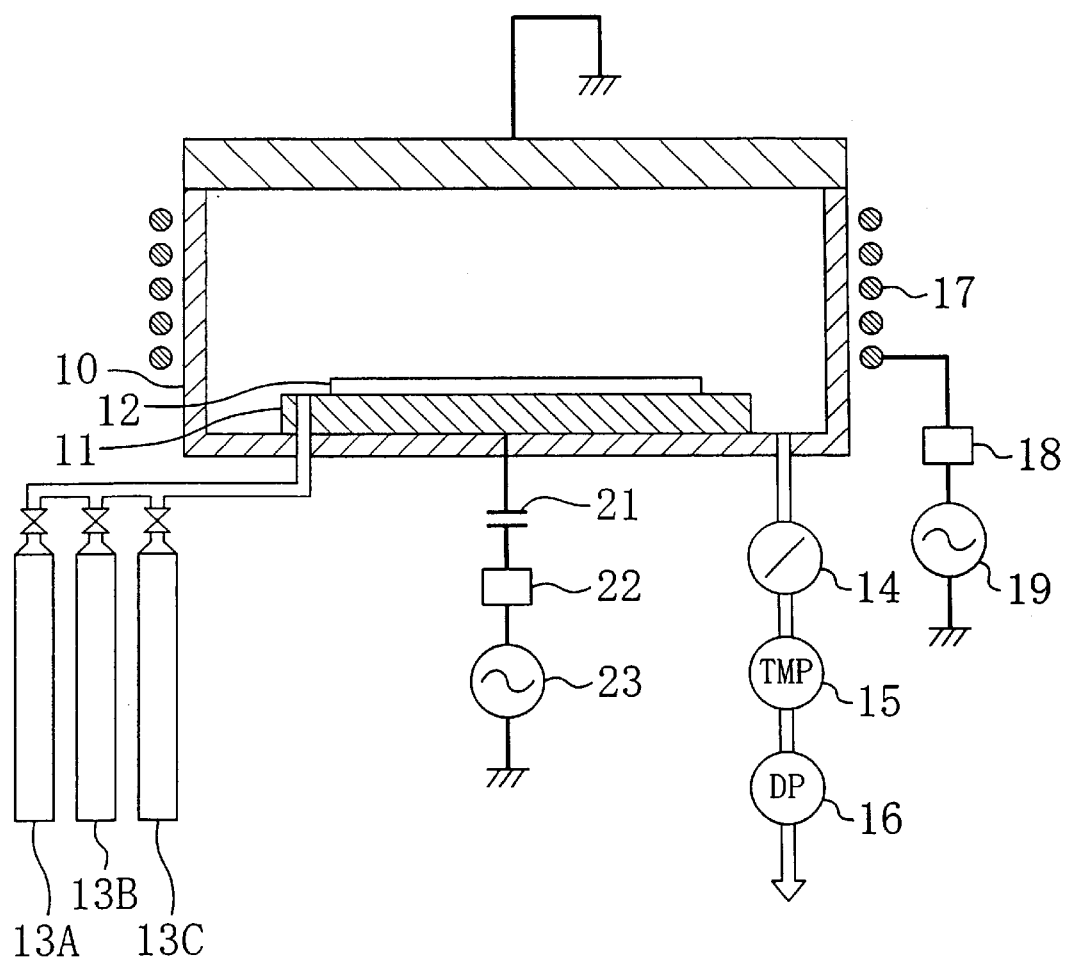
FIG. 1 is a cross-sectional view of the entire construction of an inductively coupled plasma processing apparatus used for the method for fabricating a semiconductor device of an embodiment of the present invention.

FIG. 1 is a schematic cross-sectional structure of an inductively coupled plasma processing apparatus where a bottom electrode 11 as a sample stage is disposed on the bottom of a reactor chamber 10 and holds a semiconductor substrate 12 thereon.

To the reactor chamber 10, connected are a first gas bottle 13A, a second gas bottle 13B, and a third gas bottle 13C for supply of $C_5F_8$ gas, Ar gas, and CO gas, respectively, so that $C_5F_8$ gas, Ar gas, and CO gas are introduced into the reactor chamber 10 at controlled flow rates from the first, second, and third gas bottles 13A, 13B, and 13C. The reactor chamber 10 is also provided with a gas exhaust means essentially composed of an outlet open/close valve 14, a turbo molecular pump (TMP) 15, and a dry pump (DP) 16.

A columnar coil 17 is wound around the outer circumference of a sidewall of the reactor chamber 10. An end of the columnar coil 17 is connected to a first high-frequency power source 19 via a first matching circuit 18, and the other end of the columnar coil 17 is connected to the sidewall of the reactor chamber 10 and thus grounded. Once a high-frequency power is applied to the columnar coil 17 from the first high-frequency power source 19, a high-frequency inductive electromagnetic field is generated in the reactor chamber 10, whereby the $C_5F_8$ gas, the Ar gas, and the $O_2$ gas in the reactor chamber 10 are changed to plasma. A second high-frequency power source 23 is connected to the bottom electrode 11 via a capacitor 21 and a second matching circuit 22. Once a high-frequency power is applied to the bottom electrode 11 from the second high-frequency power source 23, particles generated in the reactor chamber 10 move toward the bottom electrode 11, that is, toward the semiconductor substrate 12.

Hereinafter, an embodiment of the method for fabricating a semiconductor device of the present invention, which uses the inductively coupled plasma processing apparatus described above, will be described with reference to FIGS. 1 and 2(a) through 2(d).

Figure 2A:
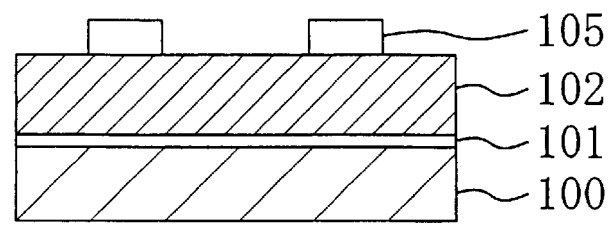
FIGS. 2(a) through 2(d) are cross-sectional views illustrating steps of the method for fabricating a semiconductor device of the embodiment of the present invention.

First, as shown in FIG. 2(a), formed sequentially on a semiconductor substrate 100 made of silicon are: a first silicon oxide film 101 made of a thermally oxidized film, for example; a metal film 102 made of aluminum or copper, for example; and a second silicon oxide film made of TEOS, for example. The second silicon oxide film is then patterned to form a hard mask 105.

Figure 2B:
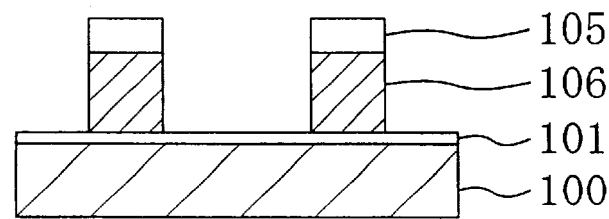

The metal film 102 is then dry-etched using the hard mask 105 as a mask, to form a plurality of metal interconnections 106 made of the metal film 102 as shown in FIG. 2(b).

Thereafter, $C_5F_8$ gas and Ar gas are supplied from the first gas bottle 13A and the second gas bottle 13B, respectively, to have a first material gas composed of the $C_5F_8$ gas and the Ar gas mixed together in the reactor chamber 10. Simultaneously, a first high-frequency-power of 400 to 3000 W having a frequency of 2.0 MHz, for example, is applied to the columnar coil 17 from the first high-frequency power source 19, to generate $C_5F_8$/Ar plasma in the reactor chamber 10. The mixture ratio of the $C_5F_8$ gas to the Ar gas is preferably in the range of 1:1 to 1:10 in volume flow rate.

Figure 2C:
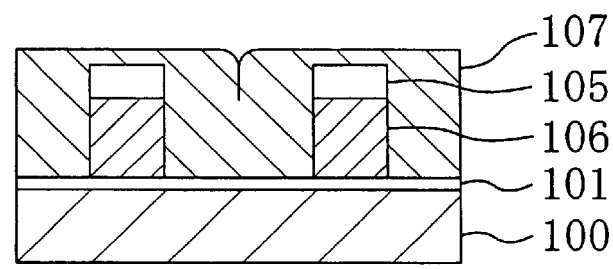

A second high-frequency power of 0 to 7.0 W/cm$^2$ having a frequency of 1.8 MHz, for example, is applied (the second high-frequency power may not be applied) to the bottom electrode 12 from the second high-frequency power source 23, to deposit a first fluorine-containing organic film 107 having a relative dielectric constant of 4 or less at least between the plurality of metal interconnections 106 as shown in FIG. 2(c).

Thereafter, $C_5F_8$ gas, Ar gas, and CO gas are supplied from the first gas bottle 13A, the second gas bottle 13B, and the third gas bottle 13C, respectively, to have a second material gas composed of the $C_5F_8$ gas, the Ar gas, and the Co gas mixed together in the reactor chamber 10. Simultaneously, the first high-frequency power of 400 to 3000 W having a frequency of 2.0 MHz, for example, is applied to the columnar coil 17 from the first high-frequency power source 19, to generate $C_5F_8$/Ar/CO plasma in the reactor chamber 10. The mixture ratio of the $C_5F_8$ gas to the Ar gas is preferably in the range of 1:1 to 1:10 in volume flow rate. The CO gas functions as a scavenger gas for scavenging (physically adsorbing and chemically reacting with) fluorine in the plasma. The mixture proportion of the CO gas will be described later.

Figure 2D:
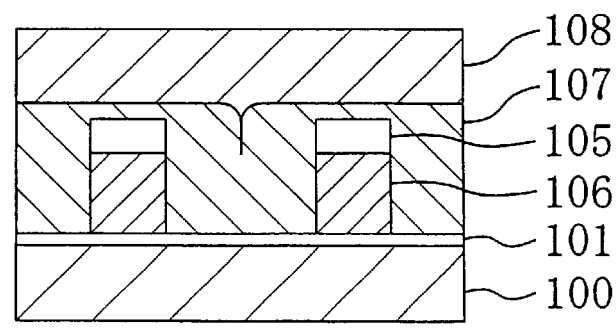

The second high-frequency power of 0 to 7.0 W/cm$^2$ having a frequency of 1.8 MHz, for example, is applied (the second high-frequency power may not be applied) to the bottom electrode 12 from the second high-frequency power source 23, to deposit a second fluorine-containing organic film 108 having a relative dielectric constant of 4 or less over the entire surface of the first fluorine-containing organic film 107 as shown in FIG. 2(d).

The second material gas contains CO gas as a scavenger gas for scavenging fluorine in the plasma. In the $C_5F_8$/Ar/CO plasma, therefore, CO ions react with F ions liberated from $C_5F_8$ to form COF. Thus, the number of F ions in the plasma of the second material gas is smaller than the number of F ions in the plasma of the first material gas. As a result, the second fluorine-containing organic film 108 deposited using the second material gas is superior in mechanical strength to the first fluorine-containing organic film 107 deposited using the first material gas, although the relative dielectric constant of the former is higher than that of the latter.

Figure 3:
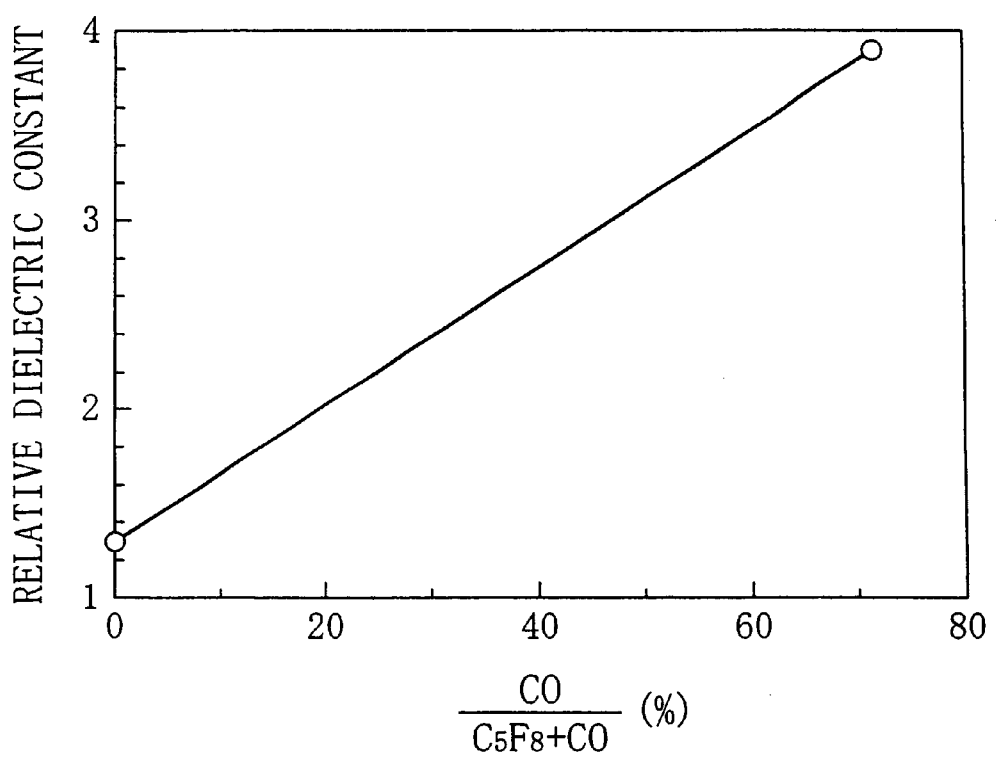
FIG. 3 is a view showing the relationship between the mixture proportion of CO gas in a total amount of $C_5F_8$ gas and CO gas in a material gas for deposition of a fluorine-containing organic film and the relative dielectric constant.

FIG. 3 shows the relationship between the mixture proportion of CO gas in a total amount of $C_5F_8$ gas and CO gas and the relative dielectric constant. As is found from FIG. 3, as the mixture proportion of CO gas is greater, the number of fluorine ions scavenged increases, which decreases the number of fluorine atoms taken in for formation of the fluorine-containing organic film, and thus the relative dielectric constant of the resultant fluorine-containing organic film is higher. The content of fluorine atoms in the fluorine-containing organic film and the mechanical strength are in the trade-off relationship. With decrease of the proportion of fluorine atoms in the film, the proportion of carbon atoms increases and thus the mechanical strength increases.

In this embodiment, no CO gas as a scavenger gas is added to the first material gas. Alternatively, a slight amount of CO gas may be added. By adding a slight amount of CO gas, superior mechanical strength is obtained, although the relative dielectric constant increases to some extent, compared with the case of adding no CO gas.

In this embodiment, CO gas is used as the scavenger gas. Alternatively, $H_2$ gas or the like may be used in place of CO gas.

Subsequently, the supply of the $C_5F_8$ gas from the first gas bottle 13A and the CO gas from the third gas bottle 13C is stopped, while the supply of the Ar gas from the second gas bottle 13B is continued. Simultaneously, the first high-frequency power of 400 to 3000 W having a frequency of 2.0 MHz, for example, is applied to the columnar coil 17 from the first high-frequency power source 19, and the second high-frequency power of 0 to 7.0 W/cm$^2$ having a frequency of 1.8 MHz, for example, is applied to the bottom electrode 12 from the second high-frequency power source 23. In this way, the second fluorine-containing organic film 108 is exposed to Ar plasma. The amount of the Ar gas supplied is not specified, but is preferably about 180 mL/min as the volume flow rate per minute in the standard conditions.

By being exposed to Ar plasma, the second fluorine-containing organic film 108 is heated with radiant heat of the plasma, raising the temperature to as high as about 300° C. By keeping the temperature of about 300° C. for about 30 seconds, the second fluorine-containing organic film 108 is densified, and thus improves in mechanical strength, heat resistance, chemical resistance, and the like. As the plasma used for densifying the second fluorine-containing organic film 108, plasma of another rare gas such as He gas may be used in place of the Ar plasma.

Figure 4A:
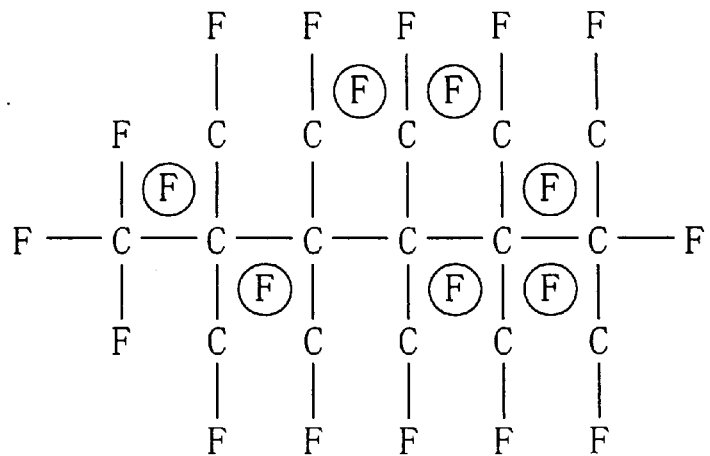
FIGS. 4(a) and 4(b) are views illustrating polymer structures of a fluorine-containing organic film before and after exposure to plasma, respectively.
Figure 4B:
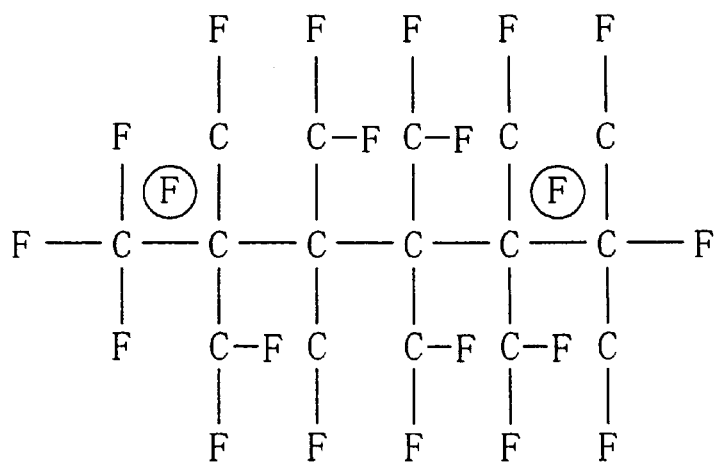

FIGS. 4(a) and 4(b) illustrate polymer structures of a fluorine-containing organic film before and after exposure to Ar plasma, respectively. As is apparent from comparison between FIGS. 4(a) and 4(b), when a fluorine-containing organic film is exposed to Ar plasma, the temperature of the fluorine-containing organic film rises, allowing free fluorine atoms existing in the polymer structure to be bound with carbon atoms. This reduces the number of free fluorine atoms and thus densities the first and second fluorine-containing organic films 107 and 108.

As a material gas for deposition of the first and second fluorine-containing organic films 107 and 108, $CF_4$ gas, $C_2F_6$ gas, $C_3F_6$ gas, $C_4F_6$ gas, or $C_4F_8$ gas may be used in place of $C_5F_8$ gas. However, $C_5F_8$ gas, $C_3F_6$ gas, and $C_4F_6$ gas are preferable to other perfluorocarbon gases for the following reason.

The first reason is as follows. All of $C_5F_8$ gas, $C_3F_6$ gas, and $C_4F_6$ gas have carbon-to-carbon double bonds. During film formation, carbon-to-carbon double bonds are dissociated, and resultant carbon atoms are bound with free fluorine atoms. This reduces the number of free fluorine atoms in the first and second fluorine-containing organic films 107 and 108. The resultant deposited first and second fluorine-containing organic films 107 and 108 are dense and improve in adhesion.

The second reason is that these gases less easily cause global warming compared with other perfluorocarbon gases. Table 1 below shows the relationships of various gases with the atmospheric life and the $GWP_{100}$ (value obtained by quantifying the warming ability over 100 years of a gas with respect to that of carbon dioxide as 1).

TABLE 1

| Kind of gas | Formula | Atmospheric life (year) | $GWP_{100}$ |
|---|---|---|---|
| Carbon dioxide | $CO_2$ | 170 | 1 |
| Tetrafluoromethane | $CF_4$ | 50000 | 6500 |
| Hexafluoroethane | $C_2F_6$ | 10000 | 9200 |
| Trifluoromethane | $CHF_3$ | 250 | 12100 |
| Octafluoropropane | $C_3F_8$ | 2600 | 7000 |
| Octafluorocyclobutane | $C_4F_8$ | 3200 | 8700 |

TABLE 1-continued

| Kind of gas | Formula | Atmospheric life (year) | $GWP_{100}$ |
|---|---|---|---|
| Octafluorocyclopentene | $C_5F_8$ | 1 | 90 |
| Hexafluoropropene | $C_3F_6$ | less than 1 | less than 100 (estimation) |
| Hexafluoropropane | $C_4F_6$ | less than 1 | less than 100 (estimation) |

As is found from Table 1, $C_5F_8$ gas, $C_3F_6$ gas, and $C_4F_6$ gas are short in atmospheric life and small in $GWP_{100}$, and therefore less easily cause global warming, compared with other perfluorocarbon gases.

As a material gas for depositing the first and second fluorine-containing organic films 107, $C_5F_8$ gas is preferable to other perfluorocarbon gases such as $C_2F_6$ gas and $C_4F_8$ gas for the following reason. The fluorine-containing organic film deposited using $C_5F_8$ gas is small in relative dielectric constant compared with a fluorine-containing organic film deposited using any of other perfluorocarbon gases, as described below in detail.

Figure 5:
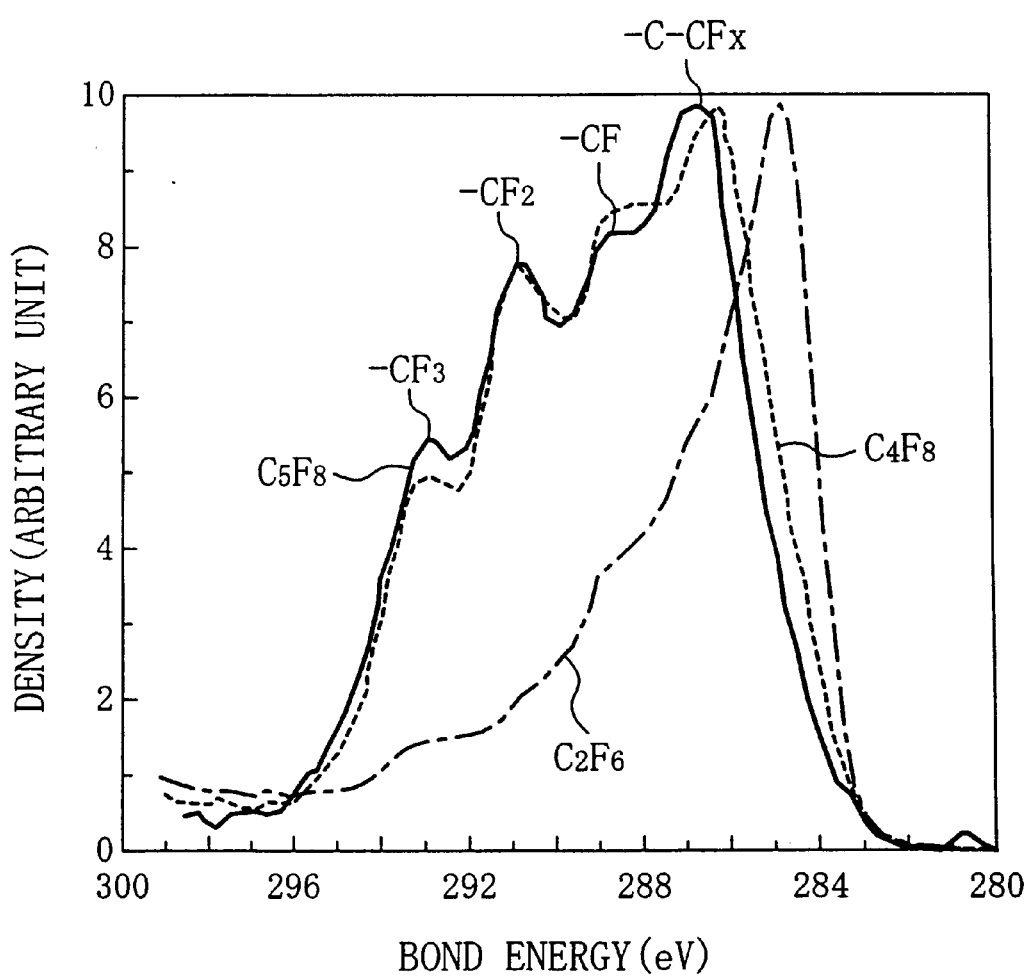
FIG. 5 is a view showing the XPS measurement results of fluorine-containing organic films deposited using $C_5F_8$ gas, $C_2F_6$ gas, and $C_4F_8$ gas.

FIG. 5 shows the results of XPS measurement of fluorine-containing organic films deposited using $C_5F_8$ gas, $C_2F_6$ gas, and $C_4F_8$ gas. From FIG. 5, it is confirmed that the amount of fluorine atoms contained in the fluorine-containing organic film deposited using $C_5F_8$ gas is larger than that in the fluorine-containing organic film deposited using $C_2F_6$ gas or $C_4F_8$ gas.

The reason why the number of fluorine atoms is large in the film formed using $C_5F_8$ gas is as follows. $C_5F_8$ gas has a large gas molecular weight. Therefore, when plasma is generated using $C_5F_8$ gas, the number of fluorine atoms in a $C_xF_y$ molecule constituting the resultant organic film is large.

For example, in comparison between $C_2F_6$ gas and $C_5F_8$ gas, $C_2F_6$ and $C_5F_8$ dissociate as follows.

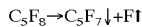

$C_2F_5$ and $C_5F_7$ constitute organic films. Therefore, naturally, the film formed by deposition of $C_5F_7$ contains a larger amount of fluorine atoms than the film formed by deposition of $C_2F_5$.

Accordingly, the interlayer insulating film formed of the first fluorine-containing organic film 107 deposited using $C_5F_8$ gas is smaller in capacitance between interconnections than an interlayer insulating film formed of a fluorine-containing organic film deposited using any of other perfluorocarbon gases. This reduces wiring delay at the metal interconnections 106.

In this embodiment, the temperature of the bottom electrode 11 was not specified in particular. During deposition, however, if the temperature of the bottom electrode 11 is lowered to reduce the temperature of the semiconductor substrate 100, the deposition rate increases. With an increased deposition rate, the first and second fluorine-containing organic films 107 and 107 can be formed efficiently. Therefore, in the process of depositing the first and second fluorine-containing organic films 107 and 108, the bottom electrode 11 is preferably cooled to keep the semiconductor substrate 100 at a low temperature.

However, when the semiconductor substrate 100 is kept at a low temperature, the efficiency decreases in the process of exposing the second fluorine-containing organic film 108 to Ar plasma to densify the film.

To overcome the above problem, in the process of densifying the film, upthrust pins (not shown) normally provided for the bottom electrode 11 are preferably thrust up to lift the semiconductor substrate 100 held on the bottom electrode 11 by about several centimeters from the bottom electrode 11. By this lifting, the semiconductor substrate 100 is detached from the cooled bottom electrode 11 and at the same time pushed closer to a plasma generation region. In this way, the second fluorine-containing organic film 108 can be obtained efficiently by deposition at a low temperature, and also the resultant second fluorine-containing organic film 108 can be densified by being brought closer to the plasma generation region.

What is claimed is:

1. A semiconductor device comprising:
a plurality of metal interconnections formed on a semiconductor substrate;
a first fluorine-containing organic film deposited at least between the plurality of metal interconnections; and
a second fluorine-containing organic film deposited on the plurality of metal interconnections and in direct contact with the first fluorine-containing organic film,
wherein the amount of fluorine atoms contained in the second fluorine-containing organic film is smaller than the amount of fluorine atoms contained in the first fluorine-containing organic film.

* * * * *